(12) United States Patent
Kizaki

(10) Patent No.: US 12,368,064 B2
(45) Date of Patent: Jul. 22, 2025

(54) TAPE AFFIXING APPARATUS

(71) Applicant: TOKYO SEIMITSU CO., LTD., Hachioji (JP)

(72) Inventor: Kiyotaka Kizaki, Hachioji (JP)

(73) Assignee: TOKYO SEIMITSU CO., LTD, Tokyo (JP)

( * ) Notice: Subject to any disclaimer, the term of this patent is extended or adjusted under 35 U.S.C. 154(b) by 246 days.

(21) Appl. No.: 18/272,072

(22) PCT Filed: Nov. 12, 2021

(86) PCT No.: PCT/JP2021/041651
§ 371 (c)(1),
(2) Date: Jul. 12, 2023

(87) PCT Pub. No.: WO2022/168392
PCT Pub. Date: Aug. 11, 2022

(65) Prior Publication Data
US 2024/0087922 A1    Mar. 14, 2024

(30) Foreign Application Priority Data
Feb. 5, 2021 (JP) ................... 2021-017860

(51) Int. Cl.
*H01L 21/67* (2006.01)
*H01L 21/683* (2006.01)

(52) U.S. Cl.
CPC .... *H01L 21/67132* (2013.01); *H01L 21/6836* (2013.01)

(58) Field of Classification Search
CPC ............ H01L 21/6836; H01L 2221/67; H01L 2221/683; H01L 2221/68304;
(Continued)

(56) References Cited

U.S. PATENT DOCUMENTS

| | | | | |
|---|---|---|---|---|
| 5,472,554 A | * | 12/1995 | Ko | B65H 35/0013 156/496 |
| 2003/0064592 A1 | * | 4/2003 | Yamamoto | H01L 21/67132 438/689 |

(Continued)

FOREIGN PATENT DOCUMENTS

| | | |
|---|---|---|
| JP | H0251249 | 2/1990 |
| JP | H0311749 | 1/1991 |

(Continued)

OTHER PUBLICATIONS

Machine Translation of Kaneshima, generated May 30, 2025 (Year: 2019).*

(Continued)

*Primary Examiner* — Andrew L Swanson
(74) *Attorney, Agent, or Firm* — Fattibene and Fattibene, LLC; Paul A. Fattibene

(57) ABSTRACT

A tape affixing apparatus that affixes a dicing tape to a workpiece and a dicing frame with appropriate tension. A tape affixing apparatus 1 affixes a dicing tape DT—to a workpiece W and a dicing frame DF in an affixing direction D1. The tape affixing apparatus 1 includes a pressing roller 34 that presses the dicing tape DT against the workpiece W and the dicing frame DF and a support pin 4 that stretches the dicing tape DT in a width direction D2.

4 Claims, 10 Drawing Sheets

(58) Field of Classification Search
CPC ........... H01L 2221/68327; H01L 2221/68354; H01L 2221/68336
See application file for complete search history.

(56) References Cited

U.S. PATENT DOCUMENTS

| | | | |
|---|---|---|---|
| 2008/0210371 A1* | 9/2008 | Saito | H01L 21/6836 156/538 |
| 2011/0259504 A1 | 10/2011 | Ishikawa | 156/73.6 |
| 2012/0097338 A1* | 4/2012 | Kaneshima | H01L 21/67132 156/494 |
| 2015/0155195 A1* | 6/2015 | Chen | H01L 21/6836 156/60 |
| 2018/0215571 A1* | 8/2018 | Inoue | G01L 5/06 |

FOREIGN PATENT DOCUMENTS

| | | |
|---|---|---|
| JP | H07211675 | 8/1995 |
| JP | 2017041595 | 2/2017 |
| JP | 2017110283 | 6/2017 |
| JP | 7130401 B2 * | 9/2022 ........ H01L 21/67092 |
| WO | WO 2010044324 | 4/2010 |

OTHER PUBLICATIONS

International Preliminary Report on Patentability in counterpart PCT application PCT/JP2021/041651, dated Oct. 6, 2022, 3 pages.
Japanese action in counterpart application No. 2021-017860, dispatched Oct. 1, 2024, with English translation, 6 pages.
International Search Report, PCT/JP2021/041651, dated Jan. 11, 2022, 3 pages.

* cited by examiner

TAPE AFFIXING APPARATUS

TECHNICAL FIELD

The present invention relates to a tape affixing apparatus.

BACKGROUND ART

In a semiconductor manufacturing field, there is a process for cutting a semiconductor substrate such as a silicon wafer (hereinafter referred to as a "workpiece") into chips. In the process, a dicing tape affixed to the workpiece restricts a position of each of the chips so that the cutting into the chips can be efficiently performed.

Patent Literature 1 discloses that an expand tape E is affixed to a wafer W adsorbed and fixed to a table 211 with a pressing force by an affixing roller. Reference signs are in Patent Literature 1.

CITATION LIST

Patent Literature

Patent Literature 1: Japanese Patent Laid-Open No. 2013-4584

SUMMARY OF INVENTION

Technical Problem

A dicing tape affixed to a workpiece and a dicing frame is stretched in a movement direction of the workpiece and the dicing frame, and tension to be exerted in a width direction perpendicular to the movement direction is liable to be low.

However, there has been a problem that if tension in each of the movement direction and the width direction to be exerted on the dicing tape is not appropriate, a proper spacing between chips cannot be ensured at the time of expansion, thereby making it difficult to detect respective positions of the chips.

Therefore, there occurs a technical problem to be solved to affix a dicing tape to a workpiece and a dicing frame with appropriate tension, and an object of the present invention is to solve this problem.

Solution to Problem

To attain the above-described object, a tape affixing apparatus for a dicing tape according to the present invention is a tape affixing apparatus that affixes a dicing tape to a workpiece and a dicing frame in a predetermined affixing direction, which includes a pressing roller that presses the dicing tape against the workpiece and the dicing frame, stretching means for stretching the dicing tape in at least a width direction perpendicular to the affixing direction as viewed from the top; an inner periphery-side table that holds the workpiece, and an outer periphery-side table on which the dicing frame is placed, wherein the stretching means is a support pin that is provided between the inner periphery-side table and the outer periphery-side table and at least a part of which is positioned above the workpiece and the dicing frame, and the support pin stretches the dicing tape sandwiched between itself and the pressing roller when swinging downward upon receipt of a pressing force by the pressing roller.

According to this configuration, stretching means stretches the dicing tape in the width direction, thereby making it possible to apply tension in the width direction to the dicing tape.

Advantageous Effect of Invention

The present invention makes it possible to affix a dicing tape to a workpiece and a dicing frame with tension in a width direction applied to the dicing tape.

BRIEF DESCRIPTION OF DRAWINGS

FIG. 6a illustrates how the affixing is started, FIG. 6b illustrates a state where the affixing is advanced, and FIG. 6c illustrates how the affixing is finished.

FIGS. 7a and 7b illustrates a state where a pressing roller has not passed over the support pin, FIGS. 7c and 7d illustrates a state where the pressing roller passes over the support pin so that the support pin swings downward by the pressing roller, and FIGS. 7e and 7f illustrates a state where the pressing roller has passed over the support pin.

FIG. 12a illustrates respective positions of the support rollers when affixing is started, FIG. 12b illustrates respective positions of the support rollers when the affixing is advanced, and FIG. 12c illustrates respective positions of the support rollers when the affixing is finished.

DESCRIPTION OF EMBODIMENTS

Figure 1:
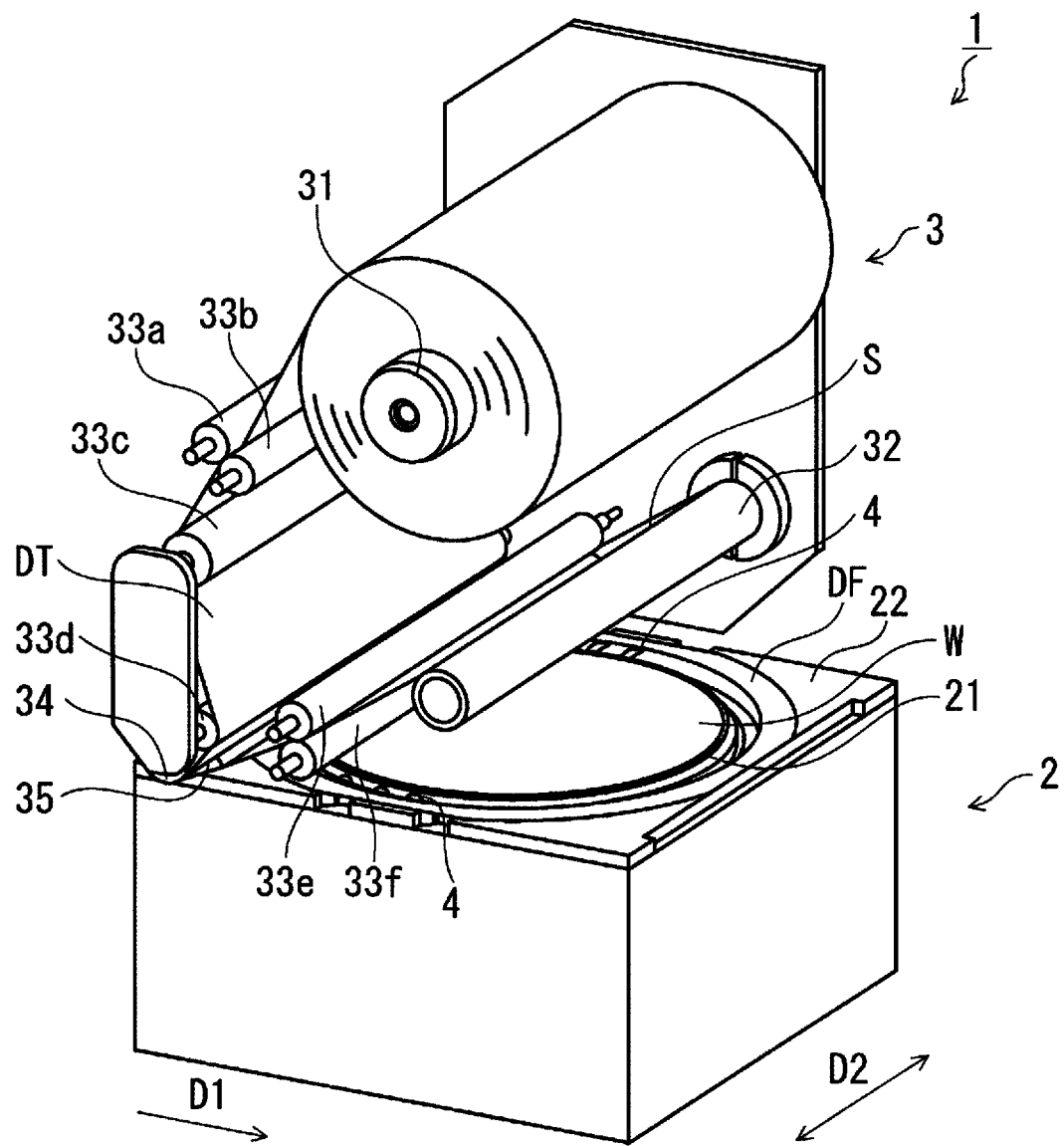
FIG. 1 is a perspective view illustrating a tape affixing apparatus according to a first embodiment of the present invention.

A first embodiment of the present invention will be described with reference to the drawings. Hereinafter, when reference is made to the number of components or a numerical value, amount, range, or the like of each of the components, the number or the like is not limited to a particular number but may be the particular number or more or the particular number or less unless otherwise stated or except when expressly limited to the particular number in principle.

When reference is made to a shape of each of components or a positional relationship among the components, a substantially approximate or similar shape or the like is included unless otherwise stated or except when considered to be expressly excluded in principle.

In the drawings, there is a case where some of components are omitted and characteristic portions are exaggerated by being enlarged, for example, in order to facilitate the understanding of features, and a dimension ratio or the like of each of the components is not necessarily the same as an actual one. In a cross-sectional view, hatching of some of the components may be omitted in order to facilitate the understanding of a cross-sectional structure of the components. In the present embodiment, terms representing directions such as up-down and left-right directions are not absolute, but are appropriate if each of the components is in an orientation depicted in the drawings. However, if the orientation has changed, the terms should be construed by being changed depending on the change in the orientation.

FIG. 1 is a perspective view illustrating a tape affixing apparatus 1. The tape affixing apparatus 1 affixes a dicing tape DT to a workpiece W and a dicing frame DF in an affixing direction D1. The workpiece W is a semiconductor substrate such as a silicon wafer, for example, but is not limited to this. The dicing tape DT is a ultraviolet curable tape, for example.

The tape affixing apparatus 1 includes a conveyance unit 2 and an affixing unit 3.

Figure 2:
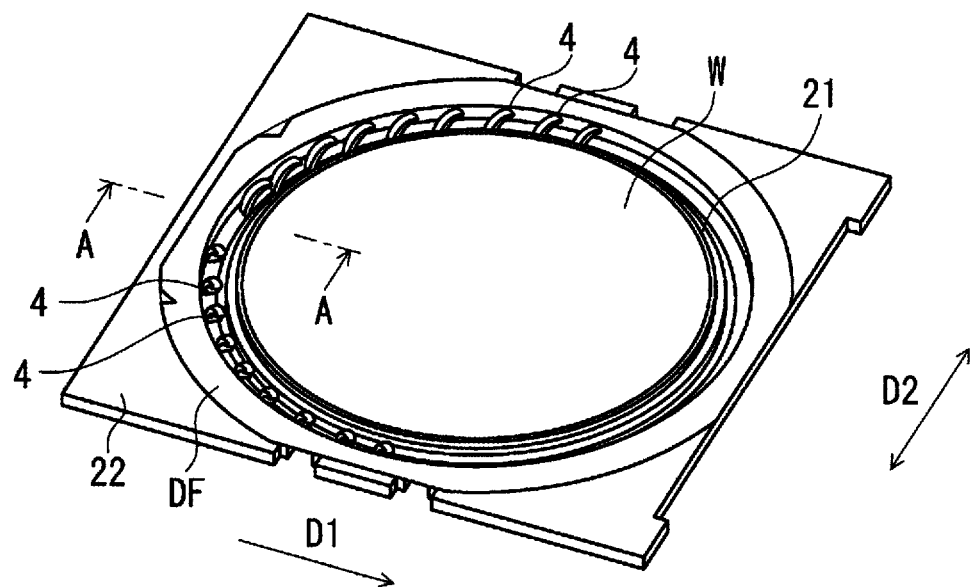
FIG. 2 is a perspective view illustrating an inner periphery-side table, an outer periphery-side table, and support pins.

As illustrated in FIG. 2, the conveyance unit 2 includes an inner periphery-side table 21 that holds the workpiece W and an outer periphery-side table 22 on which the dicing frame DF is placed.

An adsorbent 23 composed of a porous material having an infinite number of pores is embedded in a surface of the inner periphery-side table 21. The roughness of the pores in the adsorbent 23 is #400 or #800, for example.

The inner periphery-side table 21 is switchably connected to a vacuum source and a compressed air source not illustrated.

When the vacuum source is started, a negative pressure is supplied between the workpiece W placed on the inner periphery-side table 21 and an upper surface (adsorption surface 21a) of the adsorbent 23 so that the workpiece W is adsorbed and held on the adsorption surface 21a. When the compressed air source is started, compressed air (release air) is supplied between the workpiece W and the adsorption surface 21a so that the adsorption between the workpiece W and the adsorption surface 21a is released.

The inner periphery-side table 21 and the outer periphery-side table 22 are placed on a slider not illustrated, and are configured to be slidable in a conveyance direction (an opposite direction to the affixing direction D1).

As illustrated in FIG. 1, the affixing unit 3 includes a feed roller 31 that feedably supports the dicing tape DT, a winding roller 32 that winds the dicing tape DT upon application of a feeding force thereto, first to sixth guide rollers 33a to 33f that exert tension to the dicing tape DT and regulate a track of the dicing tape DT, a pressing roller 34 that affixes the dicing tape DT to the workpiece W to be movable up and down, and a knife plate 35 that regulates a tack of a separator S peeled from the dicing tape DT.

Figure 3:
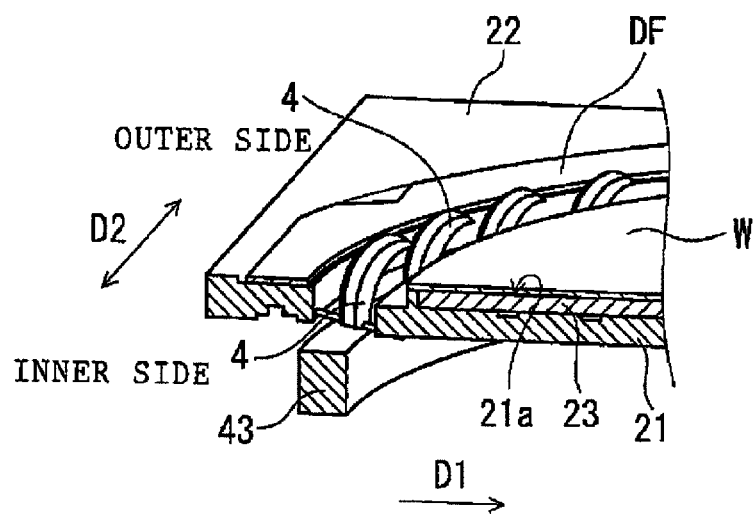
FIG. 3 is a cross-sectional view taken along a line A-A illustrated in FIG. 2.

As illustrated in FIGS. 2 and 3, the tape affixing apparatus 1 includes a plurality of support pins 4 as stretching means. The support pins 4 are provided between the inner periphery-side table 21 and the outer periphery-side table 22.

Figure 4:
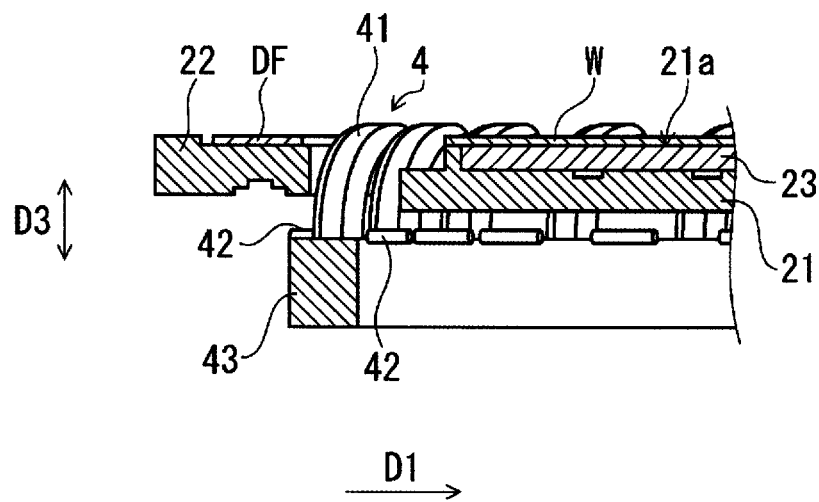
FIG. 4 is a cross-sectional view illustrating FIG. 3 as viewed in a width direction.

The support pins 4 are arranged to surround substantially the half on the forward side in the conveyance direction of the inner periphery-side table 21, as illustrated in FIG. 4. The support pins 4 are arranged to be bilaterally symmetric in a width direction D2. In FIG. 4, some of the support pins 4 are omitted.

Each of the support pins 4 is arranged to be inclined toward the forward side in the affixing direction D1 toward the outer side from the inner side in the width direction D2 as viewed from the top. Respective inclinations of the support pins 4 are set such that the more forward in the affixing direction D1 each of the support pins 4 is arranged, the closer the support pin 4 comes to a direction parallel to the affixing direction D1.

Figure 5:
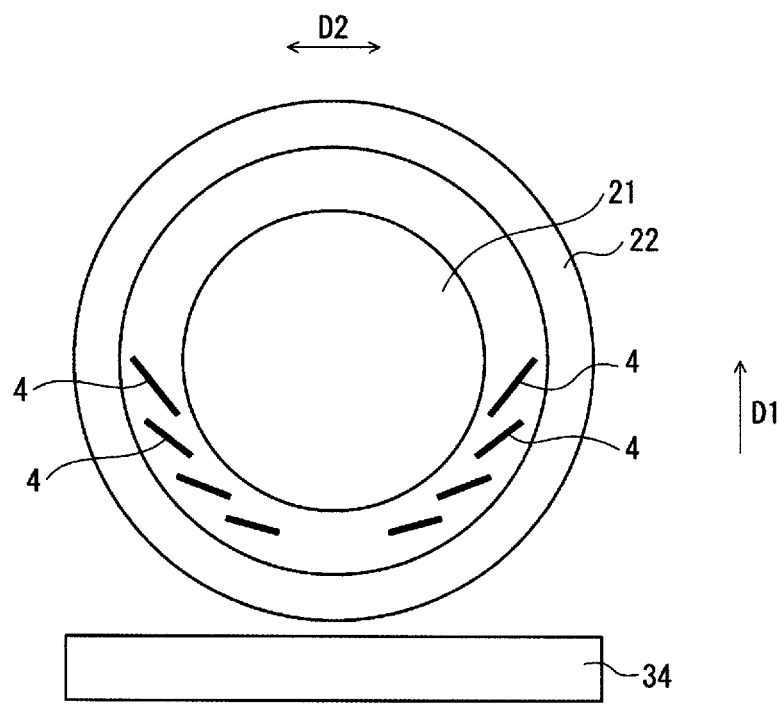
FIG. 5 is a schematic view illustrating an arrangement position of the support pins.

As illustrated in FIG. 5, each of the support pins 4 includes a pin main body 41 formed in a substantially fan shape as viewed from the side and a shaft section 42 protruding sideward from the proximal end side of the pin main body 41.

A shape of the pin main body 41 is not limited to the substantially fan shape, but may be any shape. A surface of the pin main body 41 is preferably coated with fluorine resin or knurled, for example, such that the dicing tape DT does not excessively adhere thereto.

The pin main body 41 is provided on a ring table 43 to be swingable around the shaft section 42. At least a part of the pin main body 41 is positioned above an upper surface of the dicing frame DF and an upper surface of the workpiece W in a vertical direction D3 in a no-load state where a pressing force is not exerted thereon by the pressing roller 34. The pin main body 41 has appropriate flexibility to be elastically deformed when the pressing roller 34 exerts the pressing force on the distal end side thereof, as described below.

An operation of the tape affixing apparatus 1 is controlled via a controller not illustrated. The controller controls each of components constituting the tape affixing apparatus 1. The controller is a computer, for example, and includes a CPU, a memory, and the like. A function of the controller may be implemented by control using software, or may be implemented by one that operates using hardware.

Then, the operation of the tape affixing apparatus 1 will be described with reference to the drawings.

<Workpiece Conveyance>

First, the dicing frame DF is transferred onto the outer periphery-side table 22 by a conveyance hand not illustrated, for example.

Then, the workpiece W is transferred onto the inner periphery-side table 21 by a conveyance hand not illustrated, for example. Then, when a negative pressure is supplied between the workpiece W and the adsorption surface 21a from the compressed air source, the workpiece W is adsorbed on the inner periphery-side table 21. The upper surface of the workpiece W and the upper surface of the dicing frame DF are set to be substantially flush with each other.

<Tape Affixing>

Then, the slider is driven, to move the inner periphery-side table 21 and the outer periphery-side table 22 such that one end (an affixing start position) of the dicing frame DF is arranged below the pressing roller 34.

Figure 6A:
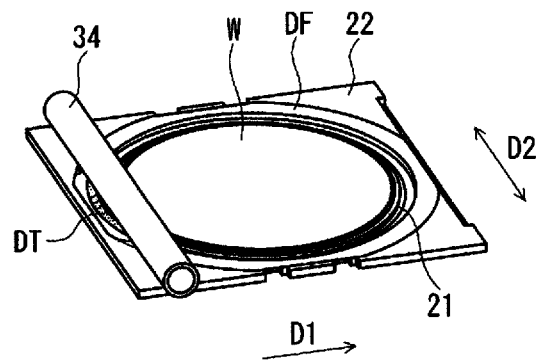
FIGS. 6a-c are a perspective view illustrating a procedure in which a dicing tape is affixed, where
Figure 6B:
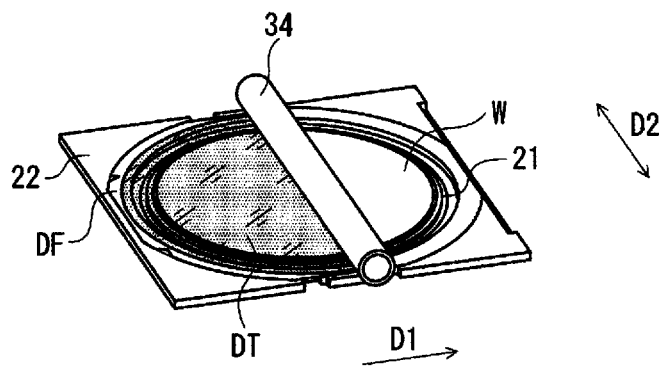
Figure 6C:
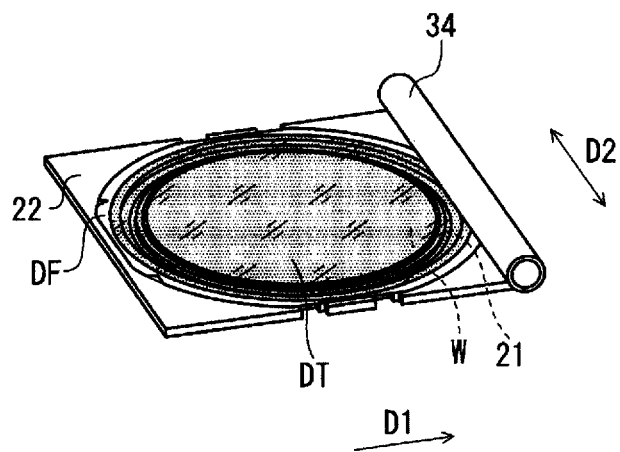
Figure 7A:
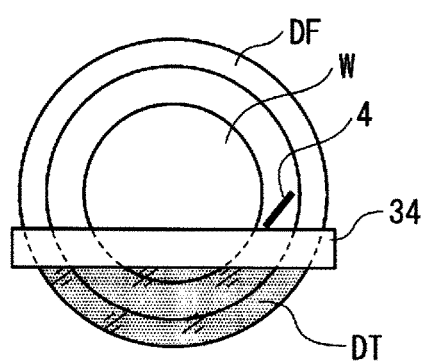
FIGS. 7a-f are a schematic view illustrating how the support pin applies tension to the dicing tape, where
Figure 7B:
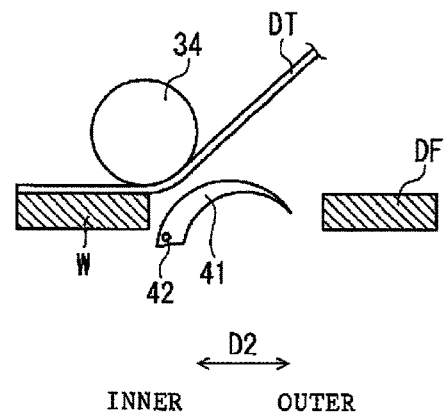
Figure 7C:
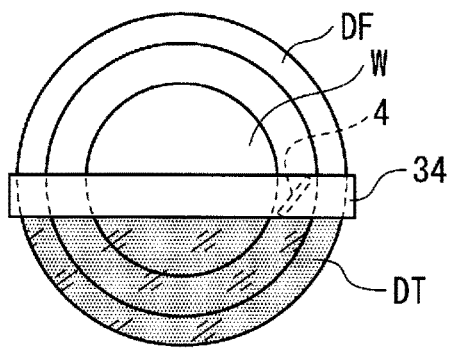
Figure 7D:
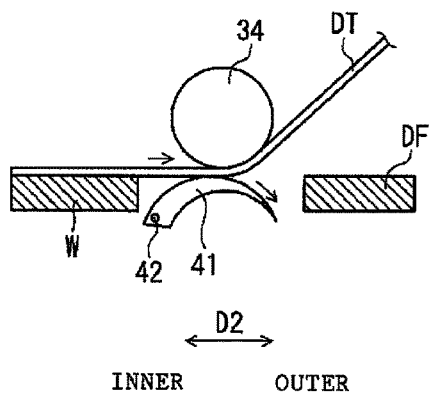
Figure 7E:
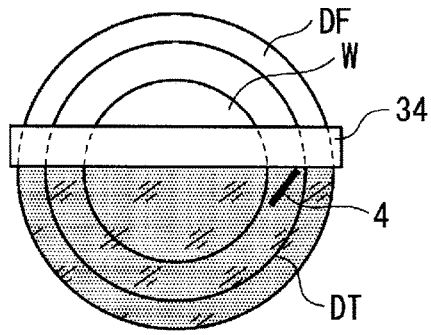
Figure 7F:
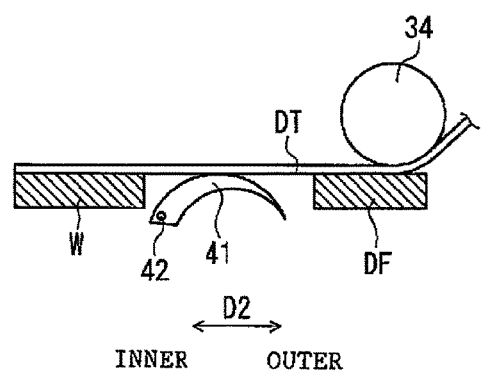

Then, as illustrated in FIG. 6(*a*), the winding roller 32 rotates to feed the dicing tape DT, and the pressing roller 34 presses the dicing tape DT against the dicing frame DF to affix the dicing tape DT with a predetermined pressing force. In FIG. 6, the support pins 4 are omitted for convenience of a space.

Then, as illustrated in FIG. 6(*b*), when the inner periphery-side table 21 and the outer periphery-side table 22 move in the conveyance direction, the affixing of the dicing tape DT to the dicing frame DF and the workpiece W is gradually advanced.

When the dicing tape DT is affixed, the support pins 4 swing toward the outer side from the inner side in the width direction D2, thereby to apply tension to the dicing tape DT.

Specifically, as illustrated in FIGS. 7(*a*) and 7(*b*), a part of the pin main body 41 is positioned above the dicing frame DF and the workpiece W in the no-load state.

Then, as illustrated in FIGS. 7(*c*) and 7(*d*), when the pressing roller 34 is positioned on the pin main body 41, the pin main body 41 swings downward around the shaft section 42 with the pressing force by the pressing roller 34. The dicing tape DT sandwiched between the pressing roller 34 and the pin main body 41 is stretched toward the outer side from the inner side in the width direction D2 as the pin main body 41 swings.

As illustrated in FIGS. 7(*e*) and 7(*f*), the pressing roller 34 affixes the dicing tape DT to the dicing frame DF with the dicing tape DT stretched. As a result, tension in the width direction D2 is applied between the dicing frame DF and the workpiece W in the dicing tape DT.

As illustrated in FIG. 6(*c*), when the dicing tape DT reaches the other end (an affixing end position) of the dicing frame DF, the workpiece W and the dicing frame DF are integrally affixed to each other with the dicing tape DT interposed therebetween.

The number of the support pins 4 and an installation position of each of the support pins 4 are not limited to those described above, but are appropriately changeable depending on a place where the tension in the width direction D2 is desired to be applied by locally stretching the dicing tape DT and the magnitude of the tension, for example.

Figure 8:
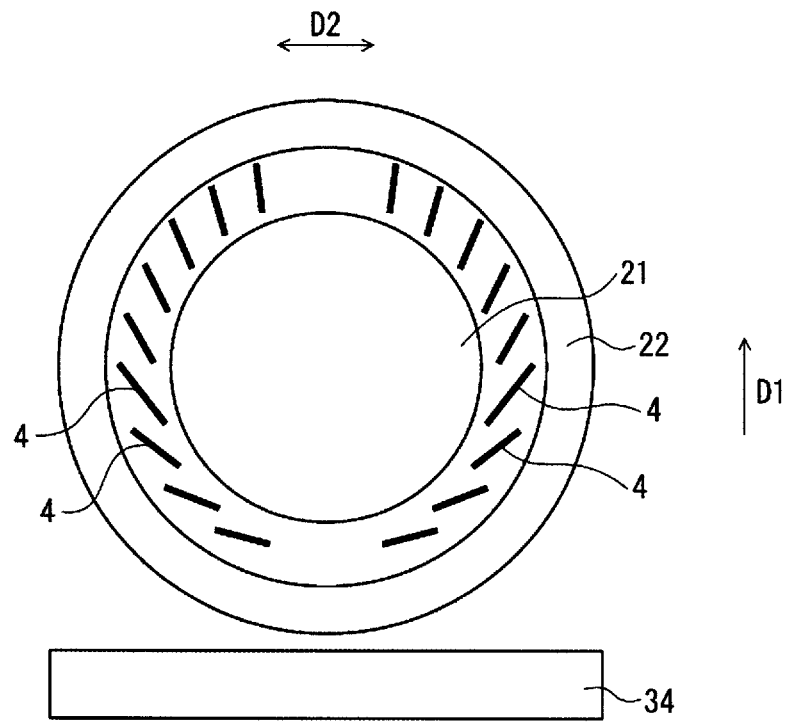
FIG. 8 is a schematic view illustrating an arrangement position of the support pins arranged to surround substantially the entire periphery of the inner periphery-side table.

For example, as illustrated in FIG. 8, the support pins 4 may be arranged to surround substantially the entire periphery of the inner periphery-side table 21. The support pins 4 illustrated in FIG. 8 are arranged to be inclined toward the forward side in the affixing direction D1 toward the outer side from the inner side in the width direction D2 as viewed from the top. The respective inclinations of the support pins 4 are set such that the more forward in the affixing direction D1 each of the support pins 4 is arranged, the closer the support pin 4 comes to a direction parallel to the affixing direction D1. The support pins 4 are provided to surround substantially the entire periphery of the inner periphery-side table 21, thereby making it possible to apply tension directed toward the outer side from the inner side in the width direction D2 over a wide range of the dicing tape DT.

Thus, the tape affixing apparatus 1 according to the present embodiment is the tape affixing apparatus 1 that affixes the dicing tape DT to the workpiece W and the dicing frame DF in the affixing direction D1, and is configured to include the pressing roller 34 that presses the dicing tape DT against the workpiece W and the dicing frame DF and the support pins 4 that stretch the dicing tape DT in the width direction D2 as viewed from the top.

According to this configuration, the support pins 4 stretch the dicing tape DT in the width direction D2, thereby making it possible to apply the tension in the width direction D2 to the dicing tape DT.

The tape affixing apparatus 1 further includes the inner periphery-side table 21 that holds the workpiece W and the outer periphery-side table 22 on which the dicing frame DF is placed, and is configured such that each of the support pins 4 is provided between the inner periphery-side table 21 and the outer periphery-side table 22, at least a part of the support pin 4 is positioned above the workpiece W and the dicing frame DF, and the support pin 4 stretches the dicing tape DT sandwiched between itself and the pressing roller 34 when swinging downward upon receipt of the pressing force by the pressing roller 34.

According to this configuration, the pressing roller 34 presses the support pins 4 after the dicing tape DT is affixed to the support pins 4 and the dicing tape DT is stretched in the width direction D2 as the support pins 4 swing, thereby making it possible to apply the tension in the width direction D2 to the dicing tape DT. Although the tension to be applied to the dicing tape DT has been described only for its component in the width direction D2 in the present embodiment, the tension to be applied to the dicing tape DT may be any tension if it includes the component in the width direction D2.

Figure 9:
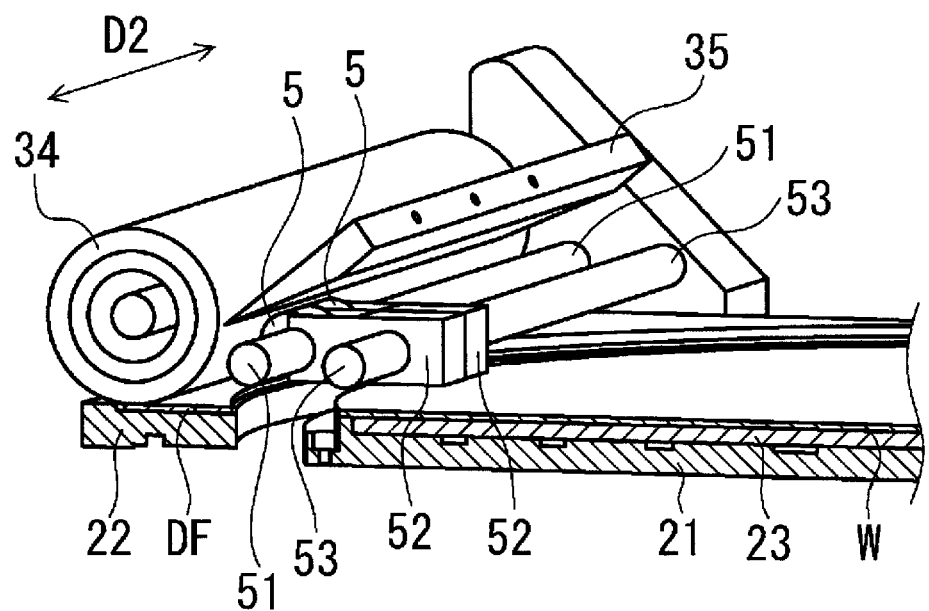
FIG. 9 is a principal part perspective view illustrating a principal part of a tape affixing apparatus according to a second embodiment of the present invention as viewed from the front in an affixing direction.
Figure 10:
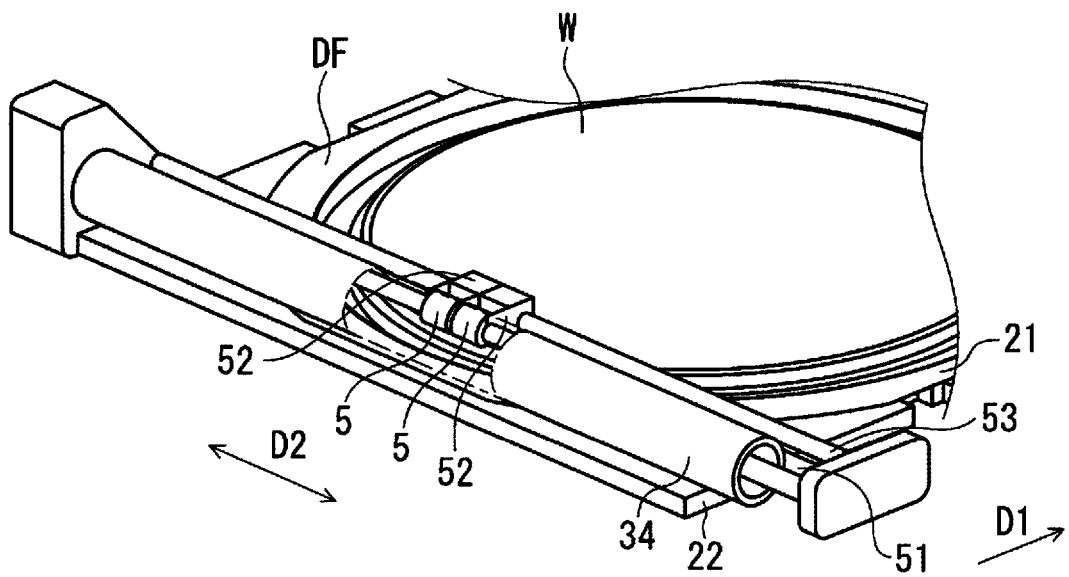
FIG. 10 is a partially cutaway perspective view illustrating the principal part of the tape affixing apparatus as viewed from the rear in the affixing direction.

Then, a tape affixing apparatus 1 according to a second embodiment of the present invention will be described with reference to the drawings. The tape affixing apparatus 1 according to the present embodiment differs in only a configuration of stretching means from the tape affixing apparatus 1 according to the above-described first embodiment. Accordingly, other common components are respectively assigned the same reference numerals, and overlapping description thereof is omitted. In FIGS. 9 and 10, a dicing tape DT is omitted for convenience of a space.

As illustrated in FIGS. 9 and 10, the tape affixing apparatus 1 is provided with a pair of left and right support roller 5 as the stretching means. A surface of each of the support rollers 5 is preferably coated with fluorine resin or knurled, for example, such that the dicing tape DT does not excessively adhere thereto.

Figure 11:
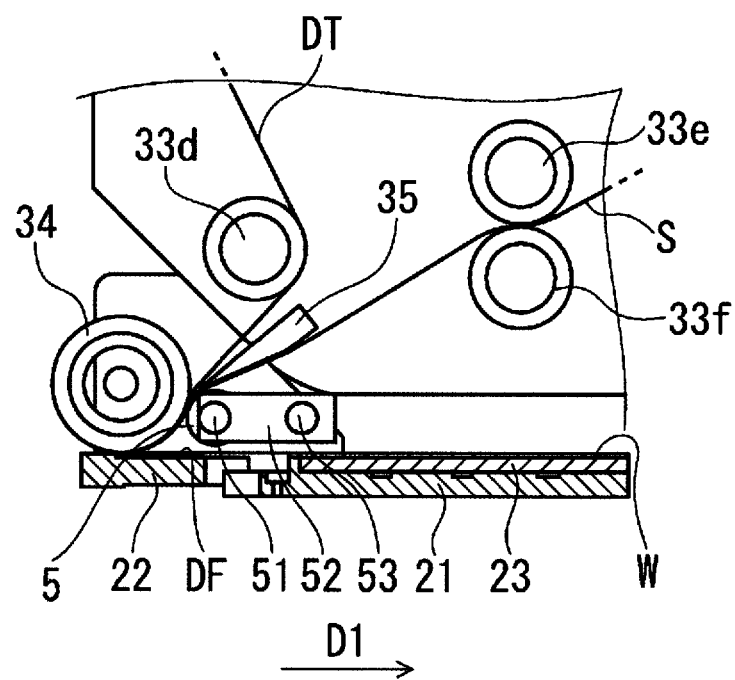
FIG. 11 is a vertical sectional view illustrating the principal part of the tape affixing apparatus.

As illustrated in FIG. 11, each of the support rollers 5 is provided to oppose a pressing roller 34 such that the dicing tape DT is positioned between itself and the pressing roller 34. Rotation shafts 51 of the support rollers 5 are respectively pivotably supported on frames 52, and the support rollers 5 respectively rotate around the rotation shafts 51 as the pressing roller 34 rotates. The rotation shafts 51 are arranged parallel to a width direction D2. The frames 52 are respectively connected to ball screws 53 that are rotatable by a driving motor not illustrated. The frames 52 are configured to move in the width direction D2 respectively depending on rotation directions of the ball screws 53.

Then, a procedure for applying tension in the width direction D2 to the dicing tape DT using the support rollers 5 will be described with reference to FIG. 12.

Figure 12A:
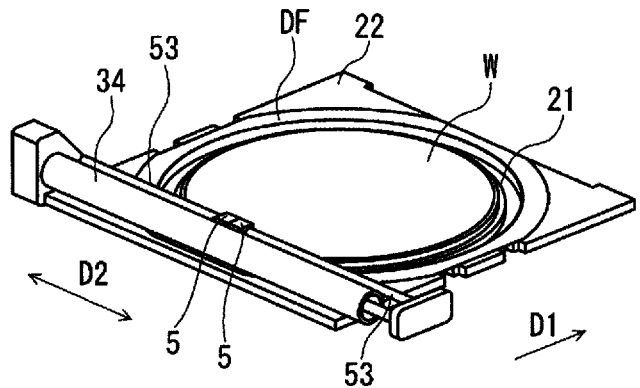
FIGS. 12a-c is a schematic view illustrating how support rollers slide in a width direction, where

First, as illustrated in FIG. 12(*a*), an inner periphery-side table 21 and an outer periphery-side table 22 are moved such that one end (an affixing start position) of a dicing frame DF is arranged below the pressing roller 34. A winding roller 32 rotates to feed the dicing tape DT, and the pressing roller 34 presses the dicing tape DT against the one end of the dicing frame DF to affix the dicing tape DT with a predetermined pressing force. At this time, the support rollers 5 are positioned at substantially the center in the width direction D2.

Figure 12B:
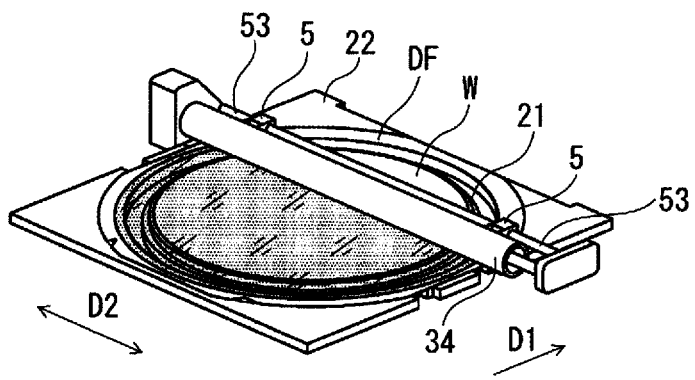

Then, as illustrated in FIG. 12(b), the inner periphery-side table 21 and the outer periphery-side table 22 move in a conveyance direction, to advance the affixing of the dicing tape DT to the dicing frame DF and a workpiece W to the vicinity of substantially the center of the dicing frame DF. At this time, the ball screws 53 respectively move the frames 52 such that the support rollers 5 move toward the outer side from the inner side in the width direction D2 as viewed from the top. The support rollers 5 stretch the dicing tape DT to pull the dicing tape DT toward the outer side in the width direction D2 when moving toward the outer side in the width direction D2 while respectively rotating by being taken around the rotation shafts 51 by friction with the dicing tape DT.

Further, the inner periphery-side table 21 and the outer periphery-side table 22 move in the conveyance direction, to advance the affixing of the dicing tape DT to the dicing frame DF and the workpiece W over the other end of the dicing frame DF from substantially the center thereof. At this time, the ball screws 53 respectively move the frames 52 such that the support rollers 5 move toward the inner side from the outer side in the width direction D2 as viewed from the top. The support rollers 5 stretch the dicing tape DT to pull the dicing tape DT toward the inner side in the width direction D2 when moving toward the inner side in the width direction D2 while respectively rotating by being taken around the rotation shafts 51 by friction with the dicing tape DT.

Figure 12C:
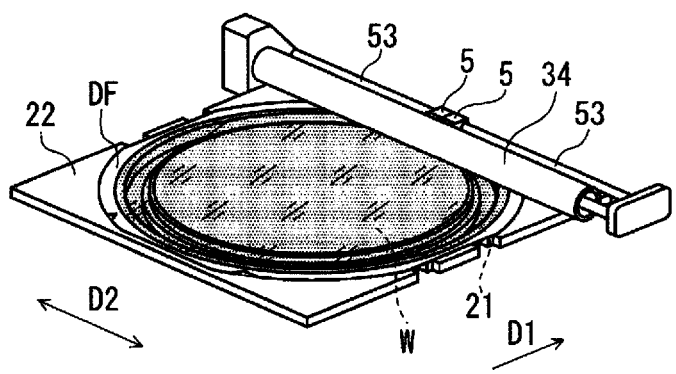

As illustrated in FIG. 12(c), when the dicing tape DT reaches the other end (an affixing end position) of the dicing frame DF, the workpiece W and the dicing frame DF are integrally affixed to each other with the dicing tape DT interposed therebetween.

Figure 13:
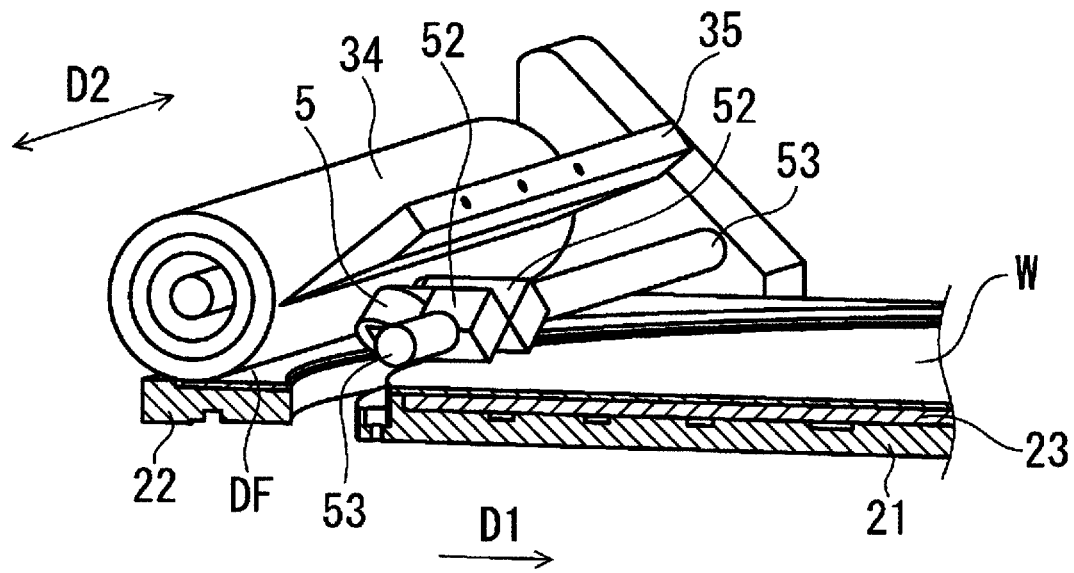
FIG. 13 is a perspective view illustrating a principal part of a tape affixing apparatus according to a modification to the present invention as viewed from the front in an affixing direction.
Figure 14:
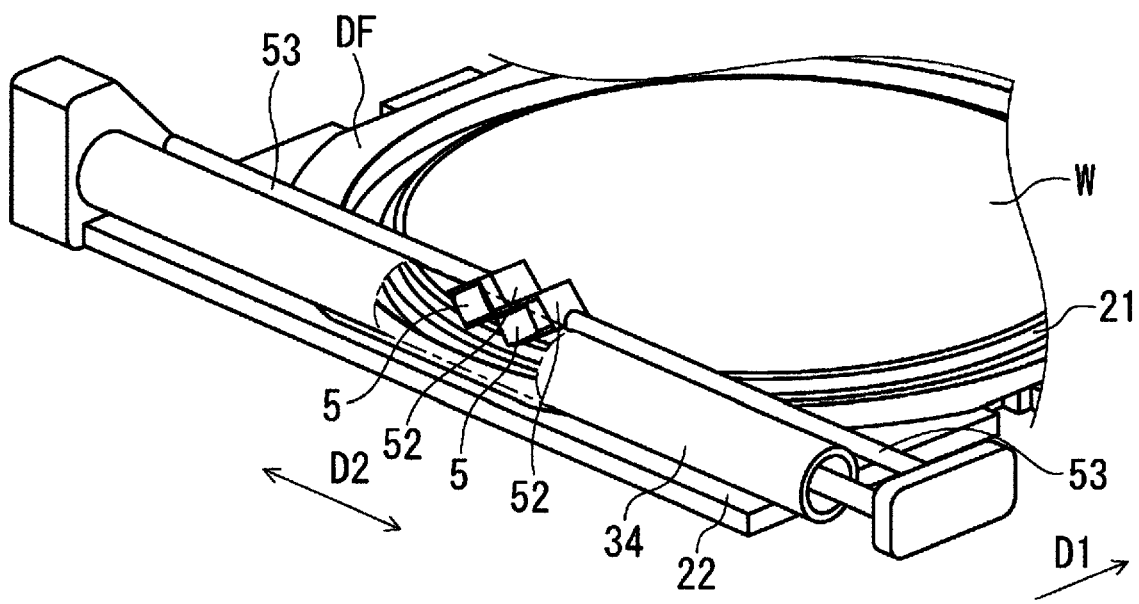
FIG. 14 is a partially cutaway perspective view illustrating the principal part of the tape affixing apparatus as viewed from the rear in the affixing direction.
Figure 15:
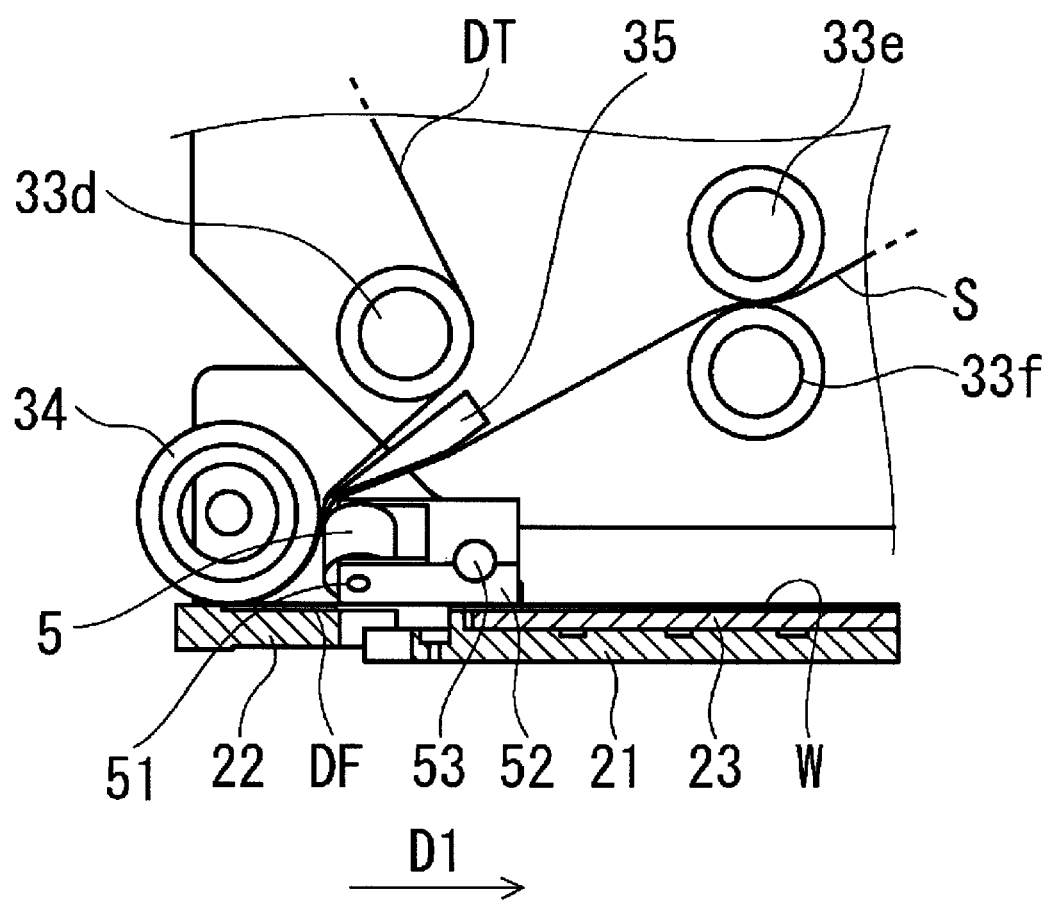
FIG. 15 is a vertical sectional view illustrating the principal part of the tape affixing apparatus.

Each of the support rollers 5 is not limited to one having a rotation shaft 51 provided parallel to a width direction D2. For example, as illustrated in FIGS. 13, 14, and 15, support rollers 5 may be provided such that their respective rotation shafts 51 are inclined in a feeding direction of a dicing tape DT. Specifically, the pair of support rollers 5 may be provided to be inclined in a substantially truncated inverted V shape in the feeding direction of the dicing tape DT as viewed in an affixing direction D1.

As a result, when the affixing of the dicing tape DT to a dicing frame DF and a workpiece W is advanced from one end of the dicing frame DF to the vicinity of substantially the center thereof, the support rollers 5 stretch the dicing tape DT to knead the dicing tape DT toward the outer side in a width direction D2 when sliding toward the outer side from the inner side in the width direction D2, thereby making it easy to apply tension to the dicing tape DT.

Thus, the tape affixing apparatus 1 according to the present embodiment is the tape affixing apparatus 1 that affixes the dicing tape DT to the workpiece W and the dicing frame DF, which is configured to include the pressing roller 34 that presses the dicing tape DT against the workpiece W and the dicing frame DF and the support rollers 5 that stretch the dicing tape DT in the width direction D2 as viewed from the top.

According to this configuration, the support rollers 5 stretch the dicing tape DT in the width direction D2, thereby making it possible to apply the tension in the width direction D2 to the dicing tape DT.

It should be understood that various modifications can be made in addition to the foregoing without departing from the spirit of the prevent invention and the present invention covers the modifications.

REFERENCE SIGNS LIST

1: tape affixing apparatus
2: conveyance unit
21: inner periphery-side table
21a: adsorption surface
22: outer periphery-side table
23: adsorbent
3: affixing unit
31: feed roller
32: winding roller
33a~33f: sixth guide roller
34: pressing roller
35: knife plate
4: support pin (stretching means)
41: pin main body
42: shaft section
43: ring table
5: support roller (stretching means)
51: rotation shaft
52: frame
53: ball screw
DF: dicing frame
DT: dicing tape
W: workpiece

The invention claimed is:

1. A tape affixing apparatus that affixes a dicing tape to a workpiece and a dicing frame in a predetermined affixing direction, the tape affixing apparatus comprising:
 a pressing roller that presses the dicing tape against the workpiece and the dicing frame; and
 stretching means for stretching the dicing tape in at least a width direction perpendicular to the affixing direction as viewed from the top;
 an inner periphery-side table that holds the workpiece, and
 an outer periphery-side table on which the dicing frame is placed, wherein
 the stretching means comprises a support pin that is provided between the inner periphery-side table and the outer periphery-side table and at least a part of which is positioned above the workpiece and the dicing frame, and
 the support pin stretches the dicing tape sandwiched between itself and the pressing roller when swinging downward upon receipt of a pressing force by the pressing roller.

2. The tape affixing apparatus according to claim 1, wherein the stretching means comprises a support roller arranged to oppose the pressing roller and provided to be slidable in the width direction to stretch the dicing tape that passes between itself and the pressing roller.

3. The tape affixing apparatus according to claim 2, wherein a rotation shaft of the support roller is provided parallel to a feeding direction in which the dicing tape is fed to the pressing roller.

4. The tape affixing apparatus according to claim 2, wherein a rotation shaft of the support roller is provided to be inclined in a feeding direction in which the dicing tape is fed to the pressing roller.

* * * * *